United States Patent [19]
Jefferies et al.

[11] Patent Number: 5,426,416
[45] Date of Patent: Jun. 20, 1995

[54] AUTOMOTIVE CURRENT SENSOR

[75] Inventors: Daniel W. Jefferies, Glen Burnie; Eric H. Naviasky, Baltimore; Donald J. Grone, Finksburg; Joseph G. Henderson, Timonium, all of Md.

[73] Assignee: Westinghouse Electric Corporation, Pittsburgh, Pa.

[21] Appl. No.: 963,711

[22] Filed: Oct. 19, 1992

[51] Int. Cl.6 ............................................. G08B 21/00
[52] U.S. Cl. ..................... 340/664; 340/635; 340/657
[58] Field of Search .............. 340/664, 641, 642, 635, 340/455, 458, 657; 307/494; 361/86, 87, 91, 93

[56] References Cited

U.S. PATENT DOCUMENTS

| | | | |
|---|---|---|---|
| 4,463,340 | 7/1984 | Adkins et al. | 340/428 X |
| 4,622,640 | 11/1986 | Shimamura et al. | 364/483 |
| 4,689,752 | 8/1987 | Fernandes et al. | 364/492 |
| 4,745,339 | 5/1988 | Izawa et al. | 340/641 X |
| 4,758,962 | 7/1988 | Fernandes | 364/483 |
| 4,777,381 | 10/1988 | Fernandes | 307/64 |
| 5,010,293 | 4/1991 | Ellersick | 323/278 |
| 5,057,814 | 10/1991 | Onan et al. | 340/641 X |

OTHER PUBLICATIONS

"Analog Devices" Low Cost, Single Supply, Differential Amplifier, model AD626, 1/1992.

Primary Examiner—Jeffery A. Hofsass
Attorney, Agent, or Firm—Eugene LeDonne

[57] ABSTRACT

A high-amperage current sensor is disclosed which is suitable for use in an automotive electrical system and which is operatively unaffected by changes in ambient temperature. The current sensor utilizes a shunt assembly having at least one low-resistance shunt element connectable in line between a source of electrical energy and a load. Circuitry preferably configured on an application specific integrated circuit measures voltage drop across the shunt element due to current flow. As a result, an output signal is produced which may be fed to external circuitry for further processing. In presently preferred embodiments, the sensor may comprise analog circuitry producing an analog output signal and/or digital circuitry producing a digital output signal.

8 Claims, 2 Drawing Sheets

AUTOMOTIVE CURRENT SENSOR

BACKGROUND OF THE INVENTION

1. Field of the Invention

The present invention relates to a high-amperage current sensor for use in automotive electrical systems. More particularly, the invention relates to an automobile current sensor which is operatively unaffected by changes in ambient temperature.

2. Description of the Prior Art

Demands placed upon the automotive industry by consumers and legislators to produce more fuel efficient vehicles have resulted in the development of a new breed of automotive sensor electronics. One particular sensor is designed to monitor steady state current drain of the car battery. This current sensor functions to monitor current loading of a specific segment of the automotive electrical system and develop an analog or digital measure of the current for use by a remote sensor computer. Data read from the current sensor is needed to determine adjustments required for improving fuel economy and other aspects of vehicle performance. In one mass-produced automobile, for example, sensor data is used to determine when to remove voltage from the alternator in order to reduce engine drag during periods of low current drain. The result of such action is a cumulative savings in fuel cost and an improvement in gas mileage.

Unlike signal applications utilizing "microammeters," automotive current sensors are required to measure high-amperage currents often approaching 200 amperes. Present systems for measuring these high current levels generally utilize a Hall-effect device mounted near the cable through which the current is being passed. These Hall-effect sensors function to develop an output voltage proportional to the magnetic field surrounding the cable.

Although Hall-effect sensors provide good electrical isolation, they are known to have many disadvantages. For example, a Hall-effect current sensor will not develop an output voltage distinguishable from system noise for magnetic flux densities below a specified magnitude. Thus, to obtain finer current measurements, it is often necessary to loop the current line one or more times through or around the sensor. This is often impractical in an automobile where space is at a premium. Additionally, the output off a Hall-effect current sensor is proportional not only to the magnetic field detected around the current line, but also to the excitation current applied through the Hall semiconductor material. Thus, for example, a 5% change in excitation current will produce the same output voltage as a 5% change in the magnetic field surrounding the current line. Since the two changes are indistinguishable, Hall-effect current sensors generally must be equipped with highly regulated current sources. This simply adds to the complexity and cost of the device.

Additionally, the output voltage of Hall-effect current sensors is affected by changes in ambient temperature. This is due to the relatively high temperature drift characteristic of the Hall semiconductor material. Specifically, a 1° C. change in ambient temperature changes output voltage in these sensors by approximately 0.1%. Thus, in applications where ambient temperature is expected to vary by more than a few degrees, it is generally necessary to compensate for the resulting variations in output voltage. This requires compensation circuitry which further adds to the complexity and cost of the device.

The need to accurately measure high-amperage current levels is even greater in electric automobiles currently being developed to reduce consumption of fossil fuels. These vehicles will almost certainly employ precision control systems, such as current injection systems, to drive multi-phase electric motors. In such systems, it is desirable to have current sensors capable of flat frequency response up to 100,000 Hertz. It is also generally desirable in these applications to have sensor phase delay of less than 5% to frequencies above 40,000 Hertz. The frequency response of Hall-effect sensors, however, is appreciably attenuated at frequencies above approximately 30,000 Hertz. As the current approaches and surpasses this frequency, excess phase delay is also introduced.

SUMMARY OF THE INVENTION

In accordance with the invention, a high-amperage current sensor suitable for use in an automobile may be provided which is without many of the disadvantages of prior art automotive current sensors. Current sensors practicing the invention utilize a shunt assembly connectable in line between a source of electrical energy and a load. The shunt assembly in one embodiment has at least one low-resistance shunt element constructed of a material, such as manganin, having characteristically small resistance drift due to variations in ambient temperature. A second embodiment uses a shunt element constructed of a material, such as copper, which is compatible with the automotive environment and a temperature compensation circuit to correct for the temperature coefficient of resistance of the copper. Circuitry preferably configured on an application specific integrated circuit ("ASIC") measures a voltage drop across the shunt element caused by the flow of current therethrough. As a result, the ASIC produces an output signal which may be fed to external processing circuitry, such as a microprocessor or a computer, for further processing. Power supply circuitry is also provided to afford the various supply voltage levels required by the ASIC.

In a presently preferred analog embodiment of the invention, first and second inputs of a difference mode amplifier are electrically connected to respective terminal sides of the shunt element. The difference mode amplifier operates to produce a difference signal representative of the voltage drop across the shunt element. The difference signal is then received by scaling circuitry which produces a ratiometric current level signal. Preferably, a buffer amplifier having a high input impedance and low output impedance receives the ratiometric current level signal and produces a current level output signal.

To indicate a maximum current level in the case of internal failure, the difference mode amplifier further includes means for producing, upon disconnection of its inputs from the shunt element, a voltage difference sufficient to indicate maximum current level. Additionally, the sealing circuitry is configured to produce a signal indicating maximum current level upon failure of the difference mode amplifier. Also, if a buffer amplifier is provided, maximum current level is indicated upon its failure by means electrically connected to the low impedance output.

A presently preferred digital embodiment of the invention is particularly well suited for high frequency applications. Additionally, it produces a digital output signal which can pass through long signal lines in "noisy" environments without degradation of signal accuracy. In this embodiment, the voltage drop across the shunt element is received as an input by sampling circuitry which produces a sampled input signal. A reference element constructed of the same material as the shunt element is electrically connected to referencing circuitry which produces a reference signal representative of resistive drift in the material due to changes in ambient temperature. The sampled input signal and the reference signal are fed to analog-to-digital conversion circuitry, which produces a temperature compensated digital output signal representative of the current to be measured. Control means are also provided on the ASIC for producing control signals to operate the sampling circuitry and analog-to-digital conversion circuitry. Isolation between the current sensor and external processing circuitry may be enhanced by passing the digital output signal through an electrical isolation coupler, such as an opto-isolator, before further processing.

DETAILED DESCRIPTION OF PRESENTLY PREFERRED EMBODIMENTS

Figure 1:
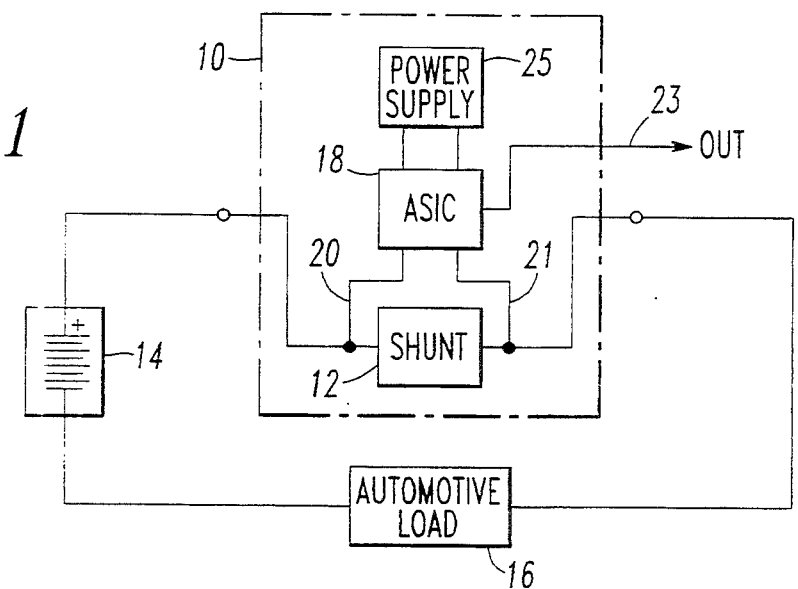
FIG. 1 is a diagrammatic representation of a high-amperage current sensor of the invention measuring current delivered from an energy source to a load.

Current sensors utilized in modern automobiles and other relatively high current precision applications are often required to have the characteristics of moniticity, linearity of better than 1%, and relative temperature invariance over the normal operating range. FIG. 1 illustrates a high-amperage current sensor 10 constructed in accordance with the invention which satisfies these criteria generally with less complexity and in a smaller module than prior art current sensors. Current sensor 10 includes a shunt assembly 12 connected in line between battery 14 and automotive load 16. Circuitry within ASIC 18 is connected via lines 20 and 21 to measure a voltage drop, $v_{in}$, across a shunt element within shunt assembly 12 due to current flow. ASIC 18 then processes this voltage drop measurement to give a current level output signal on output line 23 which may be further processed as desired by external processing circuitry. Various supply potentials required for the operation of ASIC 18 are provided by power supply 25.

In order that current sensor 10 minimally disrupt the circuit into which it is placed as well as to minimize power loss, the shunt element should be constructed having a low resistance (typically less than 1.0 mΩ). Additionally, the material chosen for the shunt element should have a relatively low resistance drift due to changes in ambient temperature. Since manganin has a resistance drift of only about ±0.015% per degree Celsius, it is thought to be particularly well suited for this purpose. When utilizing such small resistances for measurement purposes, however, the effects of contact resistance may interfere with normal operation. A Kelvin sensing topology may be used to minimize the effect of this contact resistance.

Figure 2:
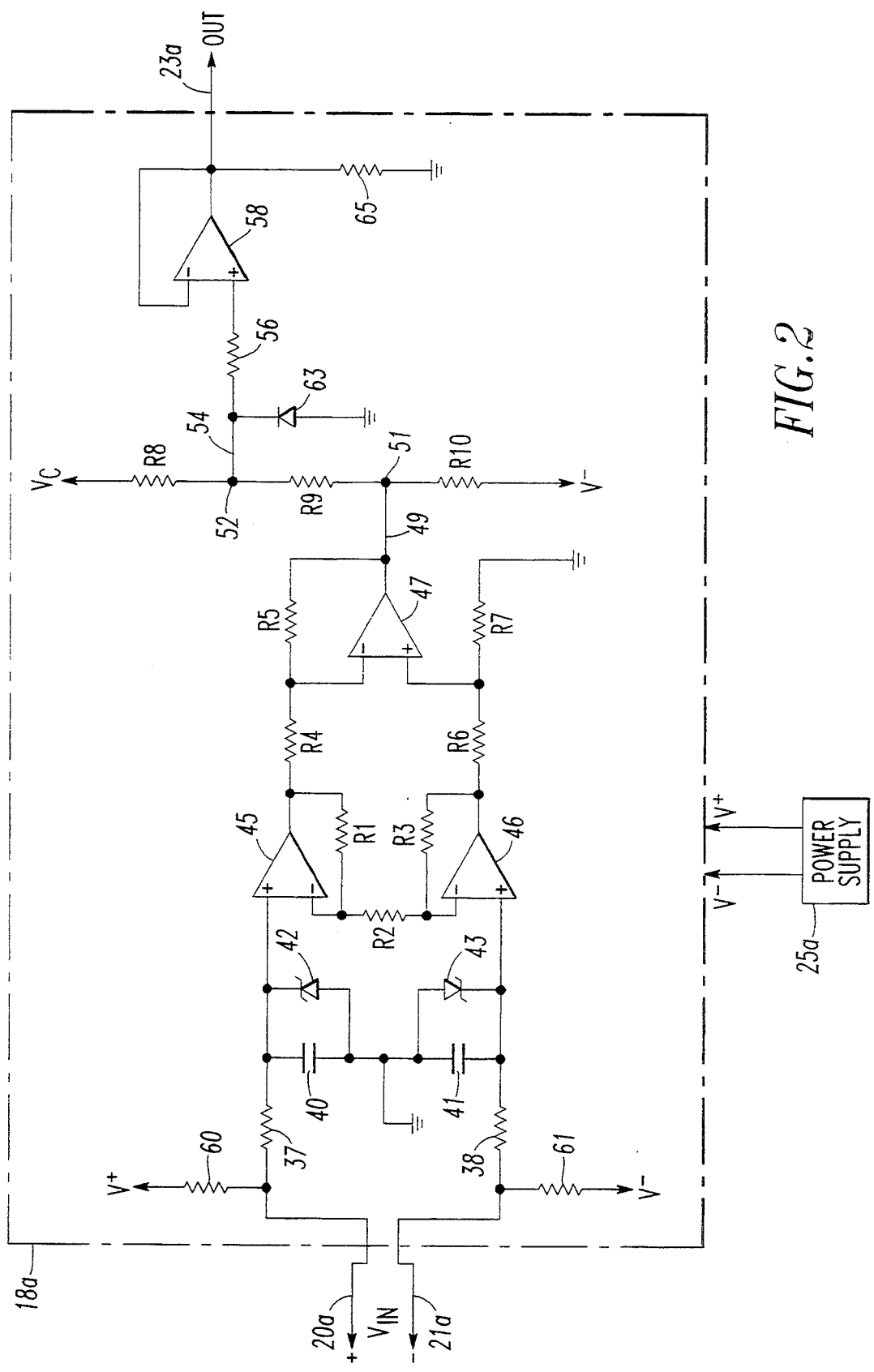
FIG. 2 is a partial schematic of a presently preferred analog embodiment of the high-amperage current sensor.

FIG. 2 schematically illustrates a presently preferred analog embodiment of current sensor 10. A voltage drop across the shunt element is fed via lines 20a and 21a to circuitry on ASIC 18a. Specifically, lines 20a and 21a are connected to current limiting resistors 37 and 38 which are in turn connected to to respective inputs of a difference mode amplifier. As shown, the difference mode amplifier may be an instrumentation amplifier having operational amplifiers 45, 46 and 47 and resistors R1 through R7. In its linear range, the instrumentation amplifier produces an inverted difference signal v' on line 49 according to the following equation:

If R4=R6, R5=R7, and R1=R3, then $$v' = -v_{in}(R5/R4)[(2R1/R2)+1]$$

The minimum shunt difference voltage detectable by the instrumentation amplifier depends upon the resistivity of the shunt element, noise and bias offset characteristics of the amplifier, and Johnson noise of resistors 37 and 38. Using a low noise instrumentation amplifier having a total input voltage noise and bias offset contribution of less than 50 microvolts, a shunt resistance of 0.333 mΩ easily provides detection of current changes exceeding one ampere. This is because, in this example, a one ampere change in current gives a 333 microvolt change in the value of $v_{in}$, which is much greater than the offset.

To ensure linear operation, operational amplifiers 45 and 46 should be supplied in this embodiment with a positive supply potential V+ exceeding the common mode voltage on the shunt element. Similarly, operational amplifier 47 should be supplied with a negative supply voltage V− also exceeding in magnitude the common mode voltage appearing on the shunt element. Voltages V+ and V− may be conveniently provided from lower 5 V or 12 V DC levels appearing in the automobile electrical system using DC—DC conversion circuitry contained within power supply 25a. Other embodiments of the difference mode amplifier exist that allow sensing a difference signal having a common mode range that includes the most positive supply voltage. This obviates the necessity of the separate power supply 25a. In some mass production applications, it may be preferable to utilize such an alternative.

The inverted difference signal appearing on line 49 is fed to scaling circuitry which produces a current level signal ratiometrically related to a preselected no-current voltage $V_c$ which may be supplied from the external processing circuitry. As shown, the scaling circuitry may simply comprise a voltage divider network having resistors R8, R9 and R10 with respective nodal connections 51 and 52 therebetween. As a result of this arrangement, the magnitude of current level signals appearing on line 54 will linearly decrease from $V_c$ as current flow through the shunt element is increased. Thus, a voltage level on line 54 equal to $V_c$ is equivalent to zero current, while a very low voltage on line 54 is equivalent to maximum current. This relationship is specifically expressed as follows:

$$v'' = V_c - [(V_c - v')(R8/R8 + R9)]$$

Thus, in addition to being linear, the current level signal is maintained in a range detectable by the external processing circuitry.

To isolate the instrumentation amplifier and ratiometric circuitry from changes in sensor loading, signal v" is fed through current limiting resistor 56 to the high impedance non-inverting input of amplifier 58. The low impedance output of amplifier 58 is connected back into the inverting input. As such, amplifier 58 is generally configured as a buffer amplifier with the signal v" being followed and reproduced on output line 23a.

To protect sensor 10 from the effects of large transients appearing in load 16 due to various non-linearities such as switching, transient suppression means are provided to maintain the voltage difference across inputs of the instrumentation amplifier within a preselected maximum range. Specifically, transient suppression networks are connected between each of the instrumentation amplifier inputs and a chassis ground. Each of the transient suppression networks may comprise respective capacitors 40 and 41 in parallel with respective zener diodes 42 and 43. Thus, capacitors 40 and 41 will function with the respective of resistors 37 and 38 as series RC circuits. The voltage rise across capacitors 40 and 41 will thus be slowed to give diodes 42 and 43 adequate time to "turn on."

In an automobile, the output of sensor 10 is used to determine actions taken to preserve fuel and improve performance of the engine. One such action is to remove or cycle voltage from the windings of the alternator to reduce drag during periods when battery 14 is lightly loaded. Additionally, the output can be used to monitor alternator current itself while the automobile is at idle to regulate and improve idle performance. If sensor 10 is thus to provide a responsible output, its output voltage due to internal failure should be equivalent to a fully loaded, heavily burdened condition on battery 14. This forces the alternator to charge continuously, allowing the automobile to function, albeit less efficiently, until sensor 10 can be repaired or replaced. Toward this end, the embodiment illustrated in FIG. 2 includes means to give an output voltage at or near ground upon occurrence of an internal failure. For example, line 20A is connected through resistor 60 to the positive supply voltage V+. Similarly, line 21A is connected through resistor 61 to the negative supply voltage V−. The values of resistors 60 and 61 should be relatively high with respect to the values of resistors 37 and 38 so as not to interfere with normal sensor operation. If, however, lines 20a and 21 become disconnected from the shunt element, the voltage difference across the inputs of the instrumentation amplifier will be large, thus producing a signal on line 23a equivalent to maximum current flow. Additionally, resistor R10 is connected to negative supply voltage V− to "pull" the voltage at nodal connection 52 to a low value if the instrumentation amplifier should fail. Reverse biased diode 63 then clamps voltage appearing on line 54 to a level slightly near zero volts. To provide a ground reference in the case of a failure of the buffer amplifier, resistor 65 is connected to the output of operational amplifier 58.

Figure 3:
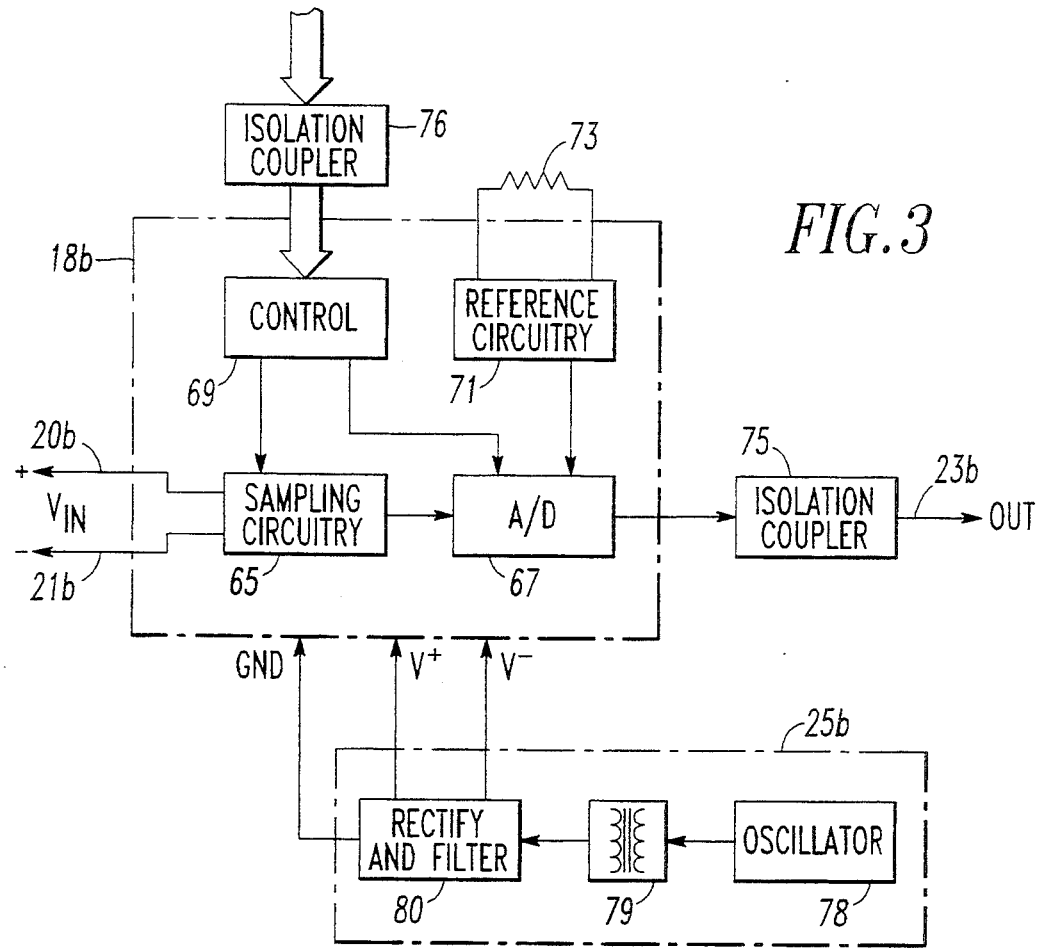
FIG. 3 is a diagrammatic representation of a presently preferred digital embodiment of the high-amperage current sensor.

FIG. 3 illustrates a presently preferred digital embodiment of current sensor 10 which may give relatively flat frequency response up to 100,000 Hz within required phase delay constraints if the shunt element is properly chosen to have a low inductance and skin effect. As with the analog embodiment of FIG. 2, lines 20b and 21b connect circuitry on ASIC 18b to respective terminal sides of the shunt element. Voltage drop $v_{in}$ is fed to sampling circuitry 65, which produces a sampled input signal. In addition to a sample and hold function, sampling circuitry 65 may also perform amplification and anti-alias filtering as necessary. The sampled input signal produced by sampling circuitry 65 is then passed to analog-to-digital conversion circuitry 67, which produces a digital output signal. Control logic to operate sampling circuitry 65 and analog-to-digital conversion circuitry 67 is provided by control 69, which may in turn receive control and clock signals from the external processing circuitry.

As with the analog embodiment, it is desirable to further mitigate the effects of variations in ambient temperature upon the output of current sensor 10. Here, however, this may be performed by analog-to-digital conversion circuitry 67 which also receives a special reference signal from reference circuitry 71. This reference signal is representative of resistive drift in the shunt material due to temperature variation. The reference signal is preferably derived by reference circuitry 71 from a reference element 73 constructed of the same material as the shunt element. In this way, the temperature co-efficient of the shunt material is cancelled by analog-to-digital conversion circuitry signal 67 in the conversion process. This allows the use of common materials, such as copper, for the shunt element which may have a higher temperature coefficient.

To provide a high degree of electrical isolation between sensor 10 and the current being measured, digital output signals from circuitry 67 may be fed to an isolation coupler 75, such as an opto isolator. As a result, isolated digital output signals are produced on output line 23b. Similarly, signals received from external processing circuitry by control 69 may also be passed through an isolation coupler 76.

Supply potentials to operate ASIC 18b are provided by power supply 25b. If used in an isolated application, power supply 25b should also preferably be isolated. In presently preferred embodiments this is accomplished by applying a periodic signal, such as square wave, produced by oscillator 78 to the primary winding of isolation transformer 79. The voltage induced on the secondary winding of transformer 79 is then passed to rectification circuitry 80, which produces the desired isolated voltage levels V+ and V−. The ground reference line may be connected to one side of the shunt element to further the augment the elimination of common mode voltage.

It can thus be seen that an automotive current sensor has been provided which gives an accurate output generally irrespective of changes in ambient temperature. Additionally, large voltage and current signals can be effectively monitored with the invention. Although certain preferred embodiments have been described and shown herein, it is to be understood that various other embodiments and modifications can be made within the scope of the following claims.

We claim:

1. An essentially temperature invarient current sensor suitable for use in an automobile to measure a current delivered from a source of electrical energy to a load and configured upon occurrence of internal failure to indicate a maximum current level, said sensor comprising:

a shunt assembly connectable in line with said source and said load, said shunt assembly having at least one low-resistance shunt element constructed of a material having characteristically small resistance drift due to variations in ambient temperature;

a difference mode amplifier having a first input electrically connected to a first terminal side of said shunt and a second input electrically connected to a second terminal side of said shunt element, said difference mode amplifier producing a difference signal representative of a voltage drop across said shunt element due to a flow of current;

said difference mode amplifier further including means for producing upon disconnection of said first and second inputs from said shunt element a voltage difference sufficient to indicate said maximum current level;

scaling circuitry electrically connected to receive said difference signal and operable to produce during normal operation of said difference mode amplifier a ratiometric current level signal; and said scaling circuitry further operable during failure of said difference mode amplifier to produce a signal indicating said maximum current level.

2. The current sensor of claim 1 further comprising a buffer amplifier having a high impedance input electrically connected to receive said ratiometric current level signal and operable to produce at a low impedance output a current level output signal.

3. The current sensor of claim 2 further comprising means electrically connected to said low impedance output for indicating said maximum current level upon failure of said buffer amplifier.

4. The current sensor of claim 1 wherein said at least one low resistance shunt element is constructed of manganin.

5. The current sensor of claim 1 further comprising transient suppression means electrically connected to said first and second inputs of said difference mode amplifier for limiting a voltage difference thereacross to a preselected maximum.

6. The current sensor of claim 5 wherein said transient suppression means comprises first and second transient suppression networks respectively connected between said first and second inputs and a ground reference, each of said first and second transient suppression networks having, in parallel, a zener diode and a capacitor.

7. The current sensor of claim 1 wherein said scaling circuitry comprises:

a first, a second and a third resistor connected in series between a positive no-current voltage and a negative power supply voltage;

a first nodal connection between said second and third resistors electrically connected to receive said difference signal; and said current level signal being produced at a second nodal connection between said first and second resistors.

8. The current sensor of claim 7 wherein said scaling circuitry further comprises a diode connected in reverse bias arrangement between said second nodal connection and a ground reference.

* * * * *